(12) United States Patent
Ishida (10) Patent No.: US 8,106,303 B2
(45) Date of Patent: Jan. 31, 2012

(54) PRINTED WIRING BOARD INCLUDING A THERMAL LAND FOR SUPRESSING HEAT DISSIPATION

(75) Inventor: Hisashi Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 417 days.

(21) Appl. No.: 12/375,946

(22) PCT Filed: Jul. 30, 2007

(86) PCT No.: PCT/JP2007/064852
§ 371 (c)(1),
(2), (4) Date: Feb. 2, 2009

(87) PCT Pub. No.: WO2008/015989
PCT Pub. Date: Feb. 7, 2008

(65) Prior Publication Data
US 2009/0183899 A1    Jul. 23, 2009

(30) Foreign Application Priority Data
Aug. 2, 2006   (JP) .................................. 2006-211450

(51) Int. Cl.
*H05K 1/00* (2006.01)
(52) U.S. Cl. ........................................ 174/252; 174/260
(58) Field of Classification Search .................. 174/252, 174/260
See application file for complete search history.

(56) References Cited

U.S. PATENT DOCUMENTS

| | | | | |
|---|---|---|---|---|
| 5,363,280 A | * | 11/1994 | Chobot et al. | 361/794 |
| 5,451,720 A | * | 9/1995 | Estes et al. | 174/250 |
| 5,473,813 A | * | 12/1995 | Chobot et al. | 29/837 |
| 6,235,994 B1 | * | 5/2001 | Chamberlin et al. | 174/252 |
| 6,388,206 B2 | * | 5/2002 | Dove et al. | 174/262 |
| 6,486,414 B2 | * | 11/2002 | Kobayashi et al. | 174/261 |
| 6,977,346 B2 | * | 12/2005 | Jairazbhoy et al. | 174/252 |
| 7,031,164 B2 | * | 4/2006 | Yamaguchi | 361/719 |
| 7,290,333 B2 | * | 11/2007 | Matsui | 29/852 |

FOREIGN PATENT DOCUMENTS

| | | |
|---|---|---|
| CN | 1383353 A | 12/2002 |
| JP | 1992080086 A | 7/1992 |
| JP | 1994314876 A | 11/1994 |
| JP | 1997008443 A | 1/1997 |
| JP | 162516 A | 6/1997 |
| JP | 1999112142 A | 4/1999 |
| JP | 200209449 A | 1/2002 |
| JP | 2002324979 A | 11/2002 |
| JP | 2005012088 A | 1/2005 |

OTHER PUBLICATIONS

International Search Report for PCT/JP2007/064852 mailed Oct. 9, 2007.
Chinese Office Action for 200780032653.6 dated May 19, 2010.

* cited by examiner

*Primary Examiner* — Hae Moon Hyeon (57) ABSTRACT

When soldering is performed, heat transferred from through hole 6b is caused to bypass a mesh-like copper foil region between non-copper-foil regions and thus the transfer of heat to a solid pattern region around thermal land 13b is delayed. Signal wirings 8e, 8f and signal wirings 8g, 8 are formed along the arrangement directions of non-copper-foil regions 15b, 16b respectively keeping a predetermined spacing between them and disposed to overlap copper foil regions, thus ensuring a current return path by means of opposing ground layer 11.

11 Claims, 7 Drawing Sheets

PRINTED WIRING BOARD INCLUDING A THERMAL LAND FOR SUPRESSING HEAT DISSIPATION

INCORPORATION BY REFERENCE

This application is the National Phase of PCT/JP2007/064852, filed Jul. 30, 2007, which claims priority to Japanese Patent Application No. 2006-211450, filed on Aug. 2, 2006, which is incorporated herein by reference in its entirety.

TECHNICAL FIELD

The present invention relates to a printed wiring board and electronic equipment comprising the printed wiring board, and for example relates to a printed wiring board in which a thermal land for suppressing heat dissipation is formed around a through hole of a solid pattern, and electronic equipment comprising the printed wiring board.

BACKGROUND ART

Electronic equipment such as computer apparatuses and communication apparatuses is generally configured to be installed with a printed wiring board, on which components such as through-hole mounted devices are mounted. Through-hole mounted devices are connected to desired conductive layers in the printed wiring board in such a way that a lead wire for soldering is inserted into a through hole provided in the printed wiring board and soldered as is.

On the other hand, as the functionality of electronic equipment becomes increasingly sophisticated in recent years, multi-layered configurations of the printed wiring board to be installed in electronic equipment have been increasingly used.

Figure 1:
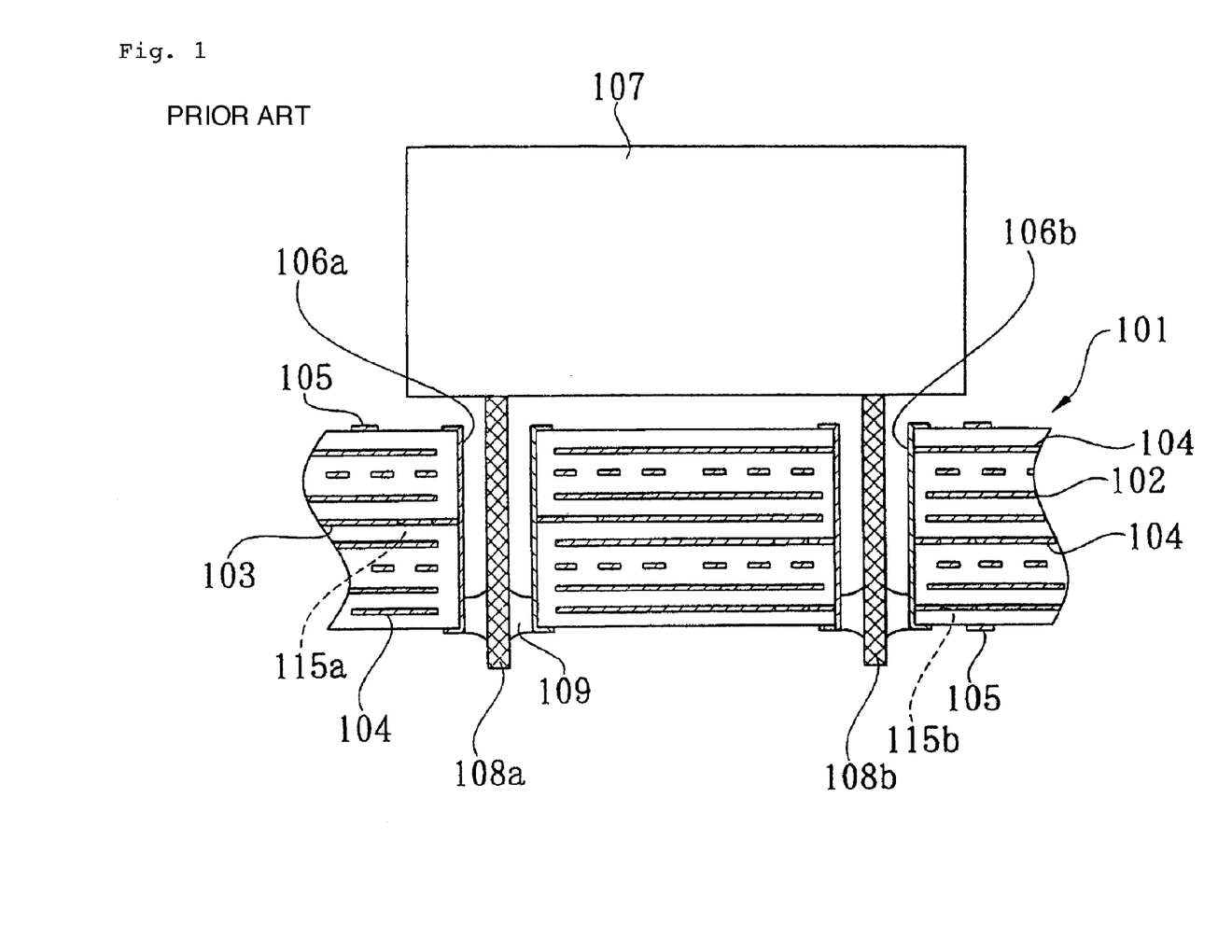
FIG. 1 is a sectional view to show the configuration of a related multilayer printed wiring board, and is an explanatory drawing to explain related arts.

In general, as shown in FIG. 1, multiplayer printed wiring board 101 has a multilayer structure comprising multiple layers including signal layer 102, power supply layer 103, and ground layer 104 as inner layers and surface layer 105. Herein, there is shown as an example, a multilayer printed wiring board of a 10-layer structure comprising four signal layers 102, one power supply layer 103, three ground layers 104, and two surface layers 105.

For example, through holes 106a and 106b are formed so as to penetrate the multiple layers and respectively connect to power supply layer 103 and ground layer 104. Through holes 106a and 106b are inserted with lead wirings 108a and 108b of through-hole mounted device 107. Through holes 106a and 106b are used to connect the terminals of through-hole mounted device 107 with power supply layer 103 and ground layer 104 as corresponding conductive layers, and to mount through-hole mounted device 107 by soldering.

That is, lead wiring 108a is used as the contact for power supply connection and lead wiring 108b is used as the contact for ground connection. It is noted that numeral 109 in FIG. 1 indicates solder.

When performing soldering, after lead wirings 108a and 108b of through-hole mounted device 107 are inserted into through holes 106a and 106b, batch soldering (dip soldering) by use of a flow apparatus or soldering by use of a soldering iron are performed.

The finished condition of soldering affects the connection reliability of the connection point of through-hole mounted device 107 and thereby affects the reliability of the entire electronic equipment in which multilayer printed wiring board 101 including through-hole mounted device 107 is installed.

One causal factor that can degrade the finished condition of soldering is a decline in the ability of molten solder to rise, in which the solder does not rise up to the ends of through holes 106a, 106b because of insufficient temperature rise during soldering. When a high quality soldering cannot be achieved throughout within through holes 106a, 106b because of the above described reason, the connection strength becomes insufficient thereby adversely affecting connection reliability.

Therefore, in order to achieve a satisfactory soldering within through holes 106a and 106b, it is necessary to sufficiently raise the temperature of the connection point by soldering with respect to the melting temperature of the solder.

For example, when heating is performed at the lower ends of through holes 106a, 106b, the heat is transferred to each conductive layer (signal layer 102, power supply layer 103, and ground layer 104) via the interior of through holes 106a, 106b.

In particular, a solid pattern made up of copper foil is formed throughout the entire surfaces of power supply layer 103 and ground layer 104, and therefore heat is diffused from through holes 106a, 106b which are connected to power supply layer 103 and ground layer 104. Since power supply layer 103 and ground layer 104 have a large heat capacity, the temperature of through holes 106a and 106b is not likely to rise during soldering. Thereby, molten solder does not rise up to the ends of through holes 106a, 106b thereby causing contact failures.

Further, as described above, the number of components mounted onto multilayer printed wiring board 101 has increased recently, the number of wirings for connecting components has also been increasing. Along with this trend, the number of layers and the thickness of multilayer printed wiring board 101 has also been increasing, and the increase in the number of layers causes an increase in heat capacity of multilayer printed wiring board 101.

In articular, the number of layers of the multilayer printed wiring board in a large scale computer apparatus etc. may be several tens of layers. As the number of layers increases, heat conduction paths are increased thereby making it difficult to raise the temperature in the vicinity of through holes 106a and 106b.

Figure 2:
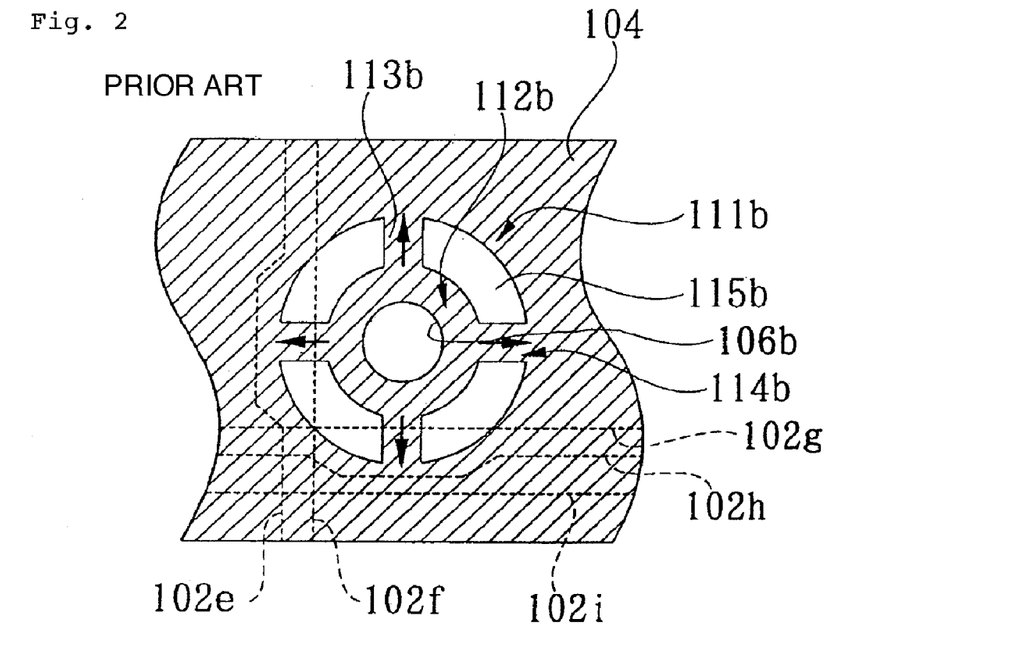
FIG. 2 is a sectional view to show the configuration of a thermal land formed in a ground layer of a related multilayer printed wiring board, and is an explanatory drawing to explain related arts.
Figure 3:
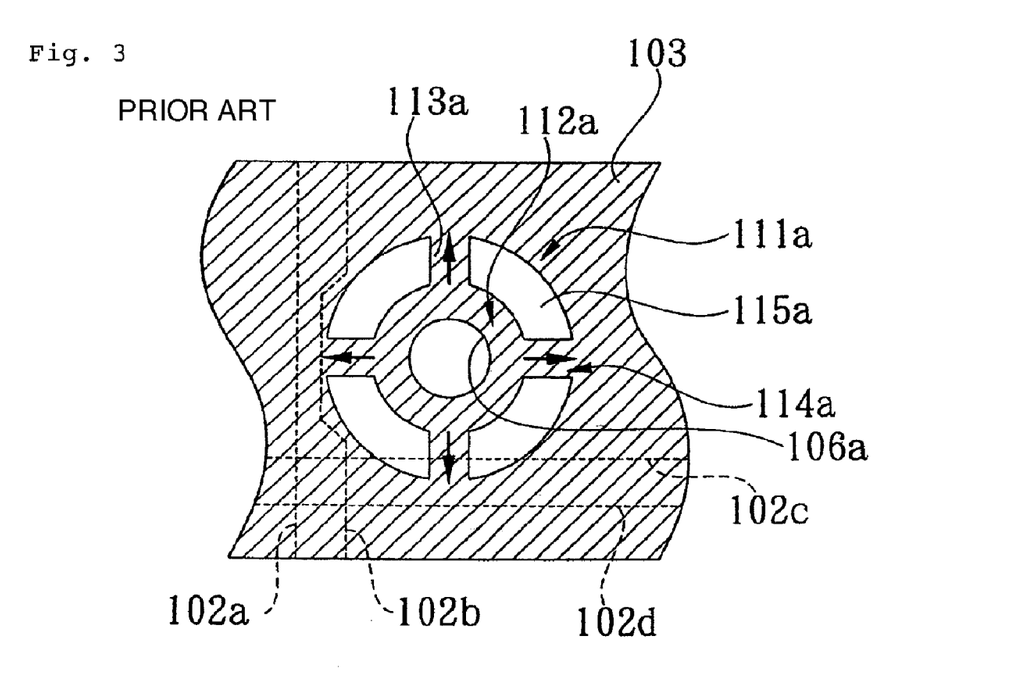
FIG. 3 is a sectional view to show the configuration of a thermal land formed in a power supply layer of the same multilayer printed wiring board, and is an explanatory drawing to explain related arts.

For this reason, as shown in FIGS. 2 and 3, thermal lands 111a and 111b for suppressing heat dissipation are formed around through holes 106a and 106b of the solid pattern of the plurality of inner layers including power supply layer 103 and ground layer 104 (for example, see Japanese Patent Laid-Open No. 09-008443, and Japanese Patent Laid-Open No. 2005-012088).

Thermal land 111b formed in ground layer 104 includes innermost peripheral region 112b and peripheral edge region 114b as shown in FIG. 2. Innermost peripheral region 112b is formed into a substantially circular ring shape around through hole 106b. Peripheral edge region 114b is formed in the peripheral edge part of innermost peripheral region 112b. Peripheral edge region 114b has spoke 113b for limiting heat conduction path, in the direction away from through hole 106b (along the radial direction with the center point of through hole 106b acting as the reference point).

In peripheral edge region 114b, there are formed spokes 113b as heat conduction paths at an equal angular spacing (at a spacing of 90 degrees) radially in four directions from innermost peripheral region 112b, and thus non-copper-foil regions 115b are formed in which copper foil is etched out in an arc shape leaving spokes 113b.

This arrangement will result in heat being conducted to the solid pattern region surrounding thermal land 111b via spokes 113b from innermost peripheral region 112b with the heat conduction path being limited in four directions as shown by the arrow in the figure. This configuration will decrease the heat capacity of through hole 106b so that the temperature inside through hole 106b can be raised to a sufficient temperature for soldering.

Further, there are formed signal wirings 102e, 102f and signal wirings 102g, 102h, 102i each of which has a predetermined width (and whose paths are shown by a dotted line in FIG. 2), in signal layers 102 which are formed immediately above and immediately below ground layer 104.

In this respect, signal wirings 102e and 102f and signal wirings 102g, 102h and 102i are respectively formed in signal layer 102. Moreover, signal wirings 102e and 102h are wired bypassing non-copper-foil region 115b. Signal wirings 102f and 102g are wired passing through non-copper-foil region 115b.

Thermal land 111a formed in power supply layer 103 includes a substantially circular ring shape innermost peripheral region 112a around through hole 106a, and peripheral edge region 114a as shown in FIG. 3. Peripheral edge region 114a includes spokes 113a for limiting the heat conduction path in the direction away from through hole 106a (along the radial direction with the center of through hole 106a being the reference point) in the peripheral edge part of innermost peripheral region 112a.

In peripheral edge region 114a, there are formed spokes 113a as heat conduction paths at an equal angular spacing (at a spacing of 90 degrees) radially in four directions from innermost peripheral region 112a, and thus non-copper-foil regions 115a are formed in which copper foil is etched out in an arc shape leaving spoke 113a.

This arrangement will result in heat conducted to the solid pattern region surrounding thermal land 111a via spokes 113a from innermost peripheral region 112a with the heat conduction path being limited in four directions as shown by the arrow in the figure. This configuration will decrease the heat capacity of through hole 106a so that the temperature within through hole 106a can be raised to a sufficient temperature for soldering. That is, through hole 106a will heat up more readily.

Further, there are formed signal wirings 102a, 102b and signal wirings 102c, 102d each of which having a predetermined width (and whose paths are shown by a dotted line in FIG. 3) in signal layers 102 which are formed immediately above and immediately below power supply layer 103.

A pair of signal wirings 102a and 102b and a pair of signal wirings 102c and 102e are respectively formed in signal layer 102. Moreover, signal wiring 102b is wired bypassing non-copper-foil region 115a. Signal wiring 102c is wired passing through non-copper-foil region 115a. It is noted that the pair of signal wirings 102a and 102b and the pair of signal wirings 102c and 102d form differential signal transmission lines.

The first problem to be solved, according to the above described related arts is that, the temperature rise during soldering is still not sufficient and the finished condition of the soldering is degraded thereby reducing connection reliability.

That is, as the functionality of electronic equipment becomes increasingly sophisticated, the related thermal land technology cannot cope with the further increase in the number of layers of the multilayer printed wiring board, and the heat conduction path will be increased making it difficult to raise the temperature in the vicinity of a through hole.

Moreover, further increase in the thickness of the multilayer printed wiring board results in longer through holes making the soldering to the interior of the through hole more difficult.

Further, when a lead-free solder (for example, tin-silver-copper lead-free solder) is used due to a compulsory requirement, a problem arises in that the melting temperature increases by several tens of degrees. That is, while the melting point of the relevant eutectic solder is 183 degrees C., the melting point of a lead-free solder, though this depends on its composition, is generally around 210 to 220 degrees C.

Therefore, when a lead-free solder is used for soldering, since heating the soldering point up to 240 to 260 degrees C. is required, the ability of molten solder to rise tends to further decline making it difficult to achieve sound soldering.

Further, the second problem, according to the above described related arts is that, since current will flow in the spoke of the thermal land, such a narrow width portion will provide a high resistance thereby causing the current capacity to decline.

That is, in the related thermal land, in order to decrease the heat capacity of a through hole, it is necessary to form non-copper-foil region (the region which is not the solid region) to be larger to some extent. However, when the printed board is used after package components are mounted thereon via lead wires, current flows through a spoke which has a locally narrow width and a large resistance, causing heat to be generated. This will lead to a decrease of current capacity and may cause the printed board to be burnt out.

Further, a third problem is that according to the above described related arts, signal transmission performance is degraded and the signal wiring density declines in signal wirings which are formed in the vicinity of through holes in the signal layers which are opposite to the power supply and ground layers formed with solid patterns via the insulation layer.

For example, as shown in FIG. 2, in the related thermal land 111b, non-copper-foil region 115b is formed in a circular ring shape around through hole 106b. Signal wirings 102f, 102g formed in a straight line has a portion which passes through non-copper-foil region 115b in ground layer 104 as an opposing solid layer. Because, in this portion, signal wiring 102f, 102g will have lost opposing ground layer 104, this will end up to cause disturbance in signal transmission.

In particular, for example as shown in FIG. 3, when a differential signal transmission line is formed by a pair of signal wirings 102c and 102d, for example, only one signal wiring 102c will pass through non-copper-foil region 115a. This would cause a difference in electric properties between the pair wirings thus causing degradation of signal transmission performance.

Further, for example as shown in FIG. 2, when disposing signal wiring 102h to avoid non-copper-foil region 115b so as to be opposite the copper foil region (solid region), the clearance between itself and adjacent signal wiring 102i will decrease thus causing the generation of cross-talk noise. Further, attempts to ensure enough clearance tend to result in a decrease in the wiring density of signal wiring.

Further, for example as shown in FIG. 3, in the case of the pair of signal wirings 102a and 102b forming a differential signal transmission line, disposing signal wiring 102b to avoid non-copper-foil region 115a so as to oppose the copper foil region (solid region) will result in a difference in the wiring length between signal wirings 102a and 102b thus causing generation of noise.

Further, a fourth problem is that, according to the above described related arts, the evenness of the conductive layer in the vicinity of a through hole degrades.

That is, in the related thermal land, a non-copper-foil region of a relatively large area is disposed in a circular ring shape around a through hole. In this non-copper-foil region, a signal layer, power supply layer, or a ground layer as a conductive layer (metal layer) located immediately below and above the aforementioned region via an insulation layer will be deflected. This tends to cause degradation of the evenness of the conductive layer of a printed wiring board and variations of the property of the printed wiring board.

BRIEF SUMMARY OF THE INVENTION

The present invention has been made in view of the above described circumstances, and its first objective is to provide a printed wiring board which can suppress thermal diffusion to maintain a good finished condition of soldering and thereby to ensure high connection reliability, and also to provide electronic equipment including the same printed wiring board that can accommodate trends towards an increase in the number of layers and use of a lead-free solder in the printed wiring board.

Further, it is a second objective of the present invention to provide a printed wiring board which ensures a current path in a solid pattern and which obtains an enough current capacity, and electronic equipment including the same printed wiring board.

Further, it is a third objective of the present invention to provide a printed wiring board which can maintain good signal transmission performance of the signal wiring and which can also increase the signal wiring density, and electronic equipment including the same printed wiring board.

Further, it is a fourth objective of the present invention to provide a printed wiring board which can maintain the evenness of the conductive layer in the vicinity of a through hole, and electronic equipment including the same printed wiring board.

In order to solve the problems, the printed wiring board of the present invention comprises: an electric component mounted thereon; an insulation layer and a conductive layer which are alternately laminated; a solid region having a large heat capacity, the solid region being formed in a predetermined portion of the conductive layer; and a thermal land formed in the solid region penetrated by a through hole such that a nonconductor portion is disposed in a distributed pattern of a mesh form or a matrix form around the through hole.

Further, the printed wiring board of the present invention may be configured such that signal wirings are formed so as not to overlap the nonconductor portion, the signal wirings being adjacent to the nonconductor portion via an insulation layer along the arrangement direction of the nonconductor portion.

Further, the solid region of the printed wiring board of the present invention may be a power supply line or a ground line.

Further, the thermal land of the printed wiring board of the present invention may be provided around the through hole of the solid region, in which the signal wiring is formed on at least one side of the solid region via the insulation layer; the signal wiring may be formed along first or/and second directions which intersect each other on the same plane; and at least part of the nonconductor portion is arranged along the first or/and second directions.

Further, the printed wiring board of the present invention is characterized in that nonconductor regions in which the nonconductor portions of a predetermined size are disposed in a substantially rectangular ring shape are provided around the through hole in multiple folds, and that the sizes of nonconductor portions making up the nonconductor regions are configured to be different from each other along the direction that proceeds away from the center of the through hole.

Further, the printed wiring board of the present invention may be configured such that the size of nonconductor portion making up the nonconductor regions becomes smaller along the direction.

Further, the printed wiring board of the present invention may be configured such that a pair of signal wirings which are adjacent to the nonconductor portions via the insulation layer along the arrangement direction of the nonconductor portions and which make up a differential signal transmission line are both formed so as to overlap the nonconductor portions or so as to overlap the conductor portion in the vicinity of the nonconductor portions, and so as to pass through the nonconductor portions or the conductor portion in substantially the same section along the wiring path.

The thermal land of the printed wiring board of the present invention may be configured such that the thermal land is formed to suppress heat dissipation when soldering a lead terminal provided in the electric component with the conductive layer at a portion of the through hole being in a condition in which the lead terminal is inserted into the through hole.

Further, the printed wiring board of the present invention may be configured such that the connection terminal provided in the electric component as a surface-mounted device and the conductive layer are connected via the through hole.

Further, the electronic equipment of the present invention comprises a printed wiring board of the present invention.

According to the present invention, the thermal land is formed such that nonconductor portions are disposed in a distributed pattern of a mesh form or a matrix form around a through hole of the conductive layer formed with the solid region. Thereby, it is possible to reduce the heat capacity of the through hole and thereby suppress the heat diffused from the through hole. As a result, according to the present invention, it becomes possible to maintain a good finished condition of soldering and thereby to ensure high connection reliability to accommodate the trends toward an increase in the number of layers and use of lead-free solder in the printed wiring board.

Further, in a thermal land, since a plurality of nonconductor portions formed by removing the conductor are disposed, and since conductor regions between nonconductor portions function as a current flow path, it becomes possible to ensure a current flow path and obtain enough current capacity.

Further, as the result of the signal wiring being formed along the arrangement direction of the nonconductor portion so as to overlap the conductor portion in the vicinity of the nonconductor portion, it is possible, for example, to maintain good signal transmission performance of the signal wiring and to improve the signal wiring density.

Furthermore, as a result of the plurality of nonconductor portions being disposed in a mesh form or in a matrix form, it becomes possible to maintain the evenness of the conductive layer in the vicinity of a through hole.

BEST MODE FOR CARRYING OUT THE INVENTION

A thermal land is formed in such a way that nonconductor portions are arranged in a distributed pattern of a mesh form or matrix form around a through hole of a conductive layer in which a solid region is formed. This configuration has enabled a decrease in the heat capacity of the through hole and enable suppressing the heat diffused from the through hole, so that the first objective to maintain a good finished condition of soldering and thereby ensure a high connection reliability to cope with the trends towards an increase in the number of layers and use of a lead-free solder in the printed wiring board is achieved.

Further, in a thermal land, a plurality of nonconductor portions, which are formed by removing the conductor, are disposed such that the conductor regions between nonconductor portions function as a current path, so that a second objective to ensure a current path thereby obtaining enough current capacity is achieved.

Further, signal wirings are formed overlapping a conductor portion in the vicinity of a nonconductor portion along the arrangement direction of the nonconductor portion, so that a third objective to keep, for example, a good signal transmission performance of the signal wiring and to improve the signal wiring density is achieved.

Further, a plurality of nonconductor portions are arranged in a mesh form or a matrix form, so that a fourth objective to maintain the evenness of the conductive layer in the vicinity of a through hole is achieved.

Exemplary Embodiment 1

Figure 4:
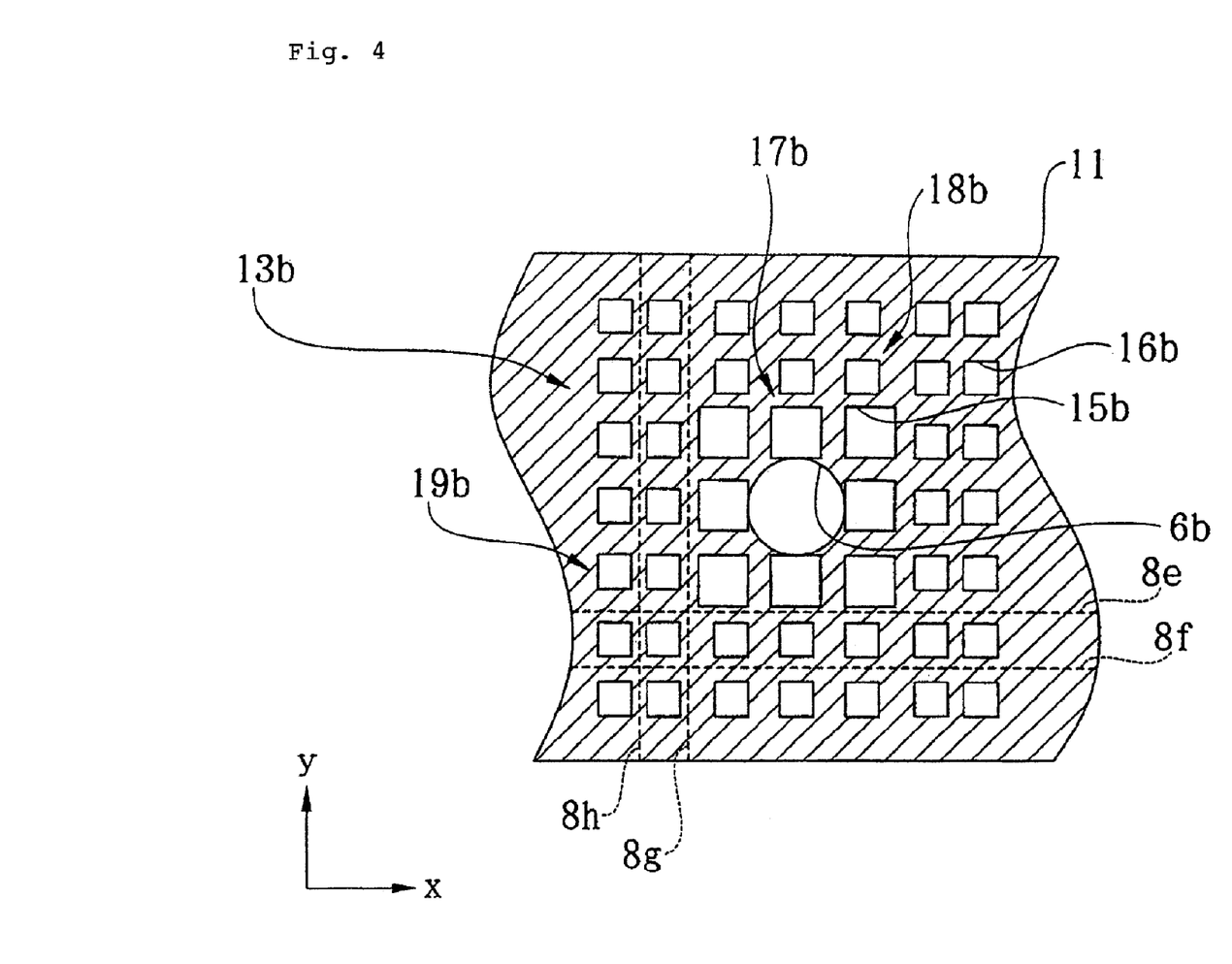
FIG. 4 is a sectional view to show the configuration of a thermal land formed in a ground layer of the multilayer printed wiring board of a first exemplary embodiment.
Figure 5:
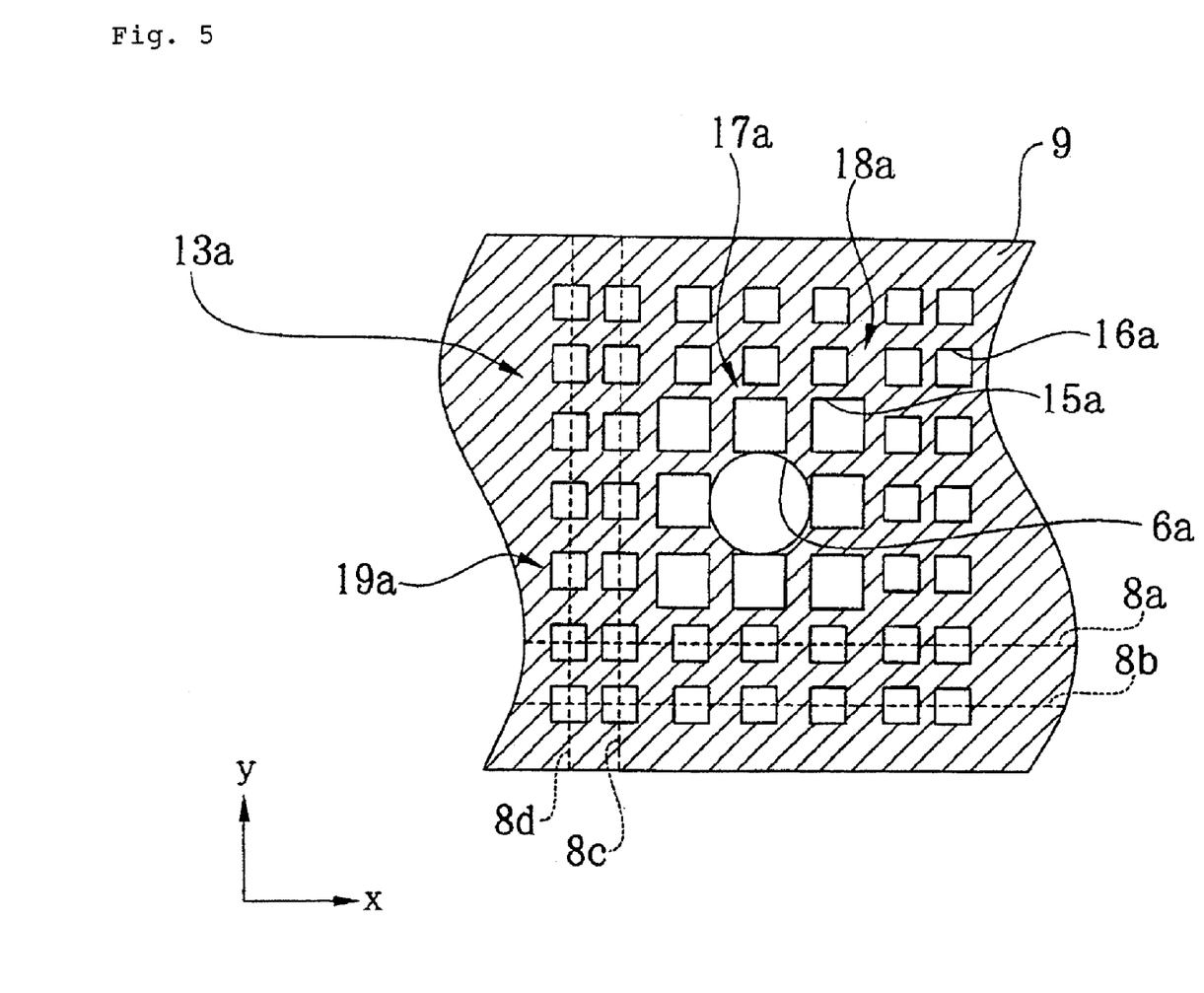
FIG. 5 is a sectional view to show the configuration of a thermal land formed in a power supply layer of the same multilayer printed wiring board.
Figure 6:
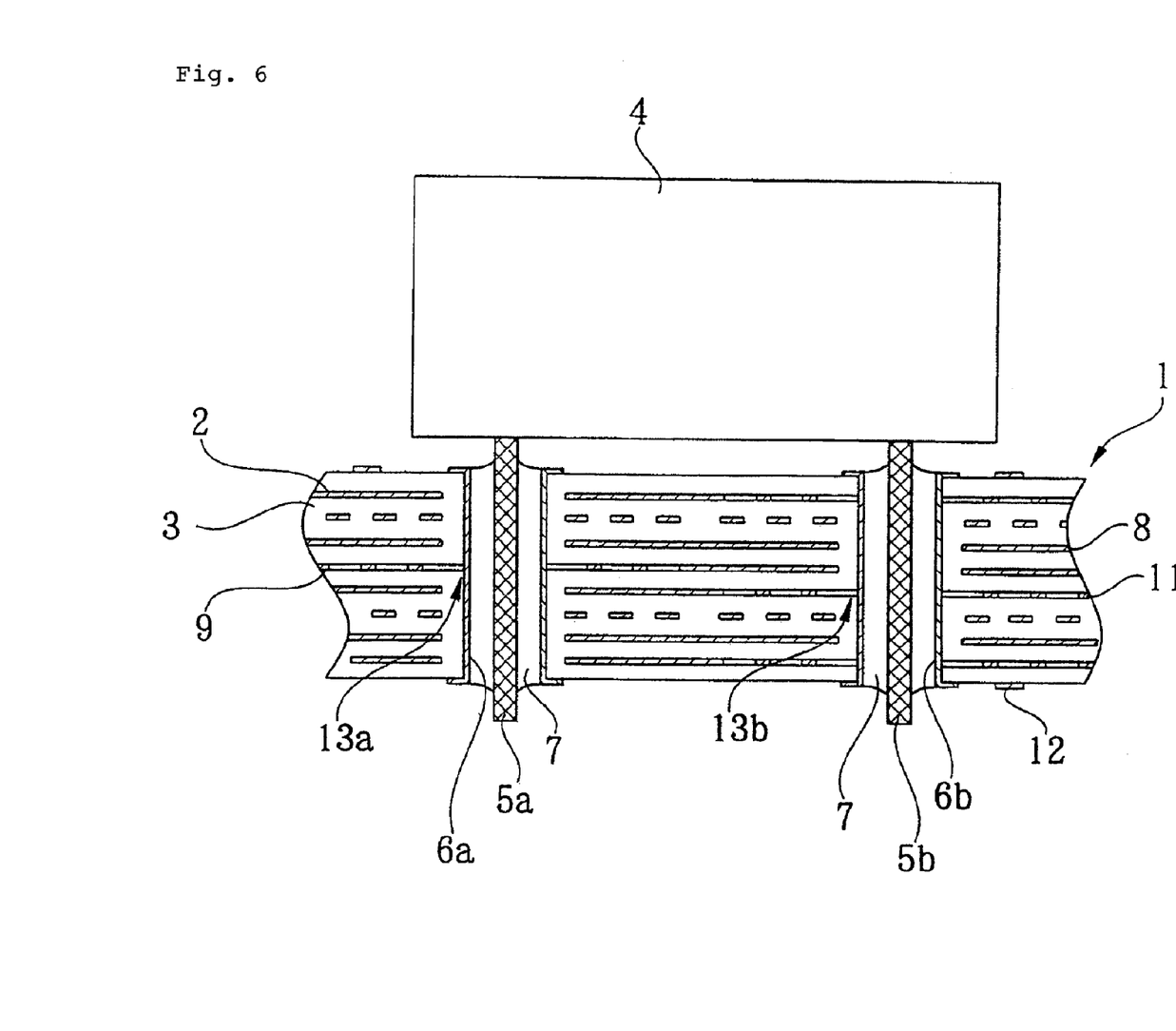
FIG. 6 is a sectional view to show the configuration of the same multilayer printed wiring board.

FIG. 4 is a sectional view showing the configuration of a thermal land formed in the ground layer of the multilayer printed wiring of board of a first exemplary embodiment. FIG. 5 is a sectional view showing the configuration of a thermal land formed in a power supply layer of the same multilayer printed wiring board. FIG. 6 is a sectional view to show the configuration of the same multilayer printed wiring board.

Multilayer printed wiring board 1 of this example is installed in electronic equipment such as computers and communication apparatuses, and has a multilayer structure in which a plurality of conductive layers 2 and insulation layers 3 are alternately laminated as shown in FIG. 6. Further, multilayer printed wiring board 1 includes a plurality of through holes 6a, 6b, . . . . The plurality of through holes 6a, 6b, . . . penetrate a plurality of conductive layers 2 and insulation layers 3 from the front face to the rear face, are inserted with lead wirings 5a, 5b, . . . for soldering of through-hole mounted devices (inserted components with a lead wire) 4 as electronic or electric components.

Through holes 6a, 6b, . . . are inserted with lead wirings 5a, 5b, . . . of through-hole mounted device 4. Then, through holes 6a, 6b . . . are filled with solder 7 with lead wirings 5a, 5b, . . . being inserted therein. The terminal of through-hole mounted device 4 is connected to corresponding conductive layer 2 thereby being mounted thereto.

For example, lead wirings 5a and 5b of through-hole mounted device 4 are respectively used as the contact for power supply connection and the contact for ground connection to be connected to power supply layer 9 and ground layer 11 via through holes 6a, 6b. Moreover, the inner walls of through holes 6a, 6b, . . . are each applied with metal plating.

Each conductive layer 2 is made up of signal layer 8, power supply layer 9, ground layer 11 or surface layer 12. Herein, there is shown an example of a multilayer printed wiring board having a 10-layer structure made up of four signal layers 8, one power supply layer 9, three ground layers 11, and two surface layers 12.

In particular, power supply layer 9 and ground layer 11 are configured to be a solid pattern in which a conductive region is formed over its entire surface except through holes 6a and 6b and except non-copper-foil regions to be described later around through holes 6a and 6b. Further, as shown in FIGS. 4 and 5, thermal lands 13a and 13b for suppressing heat diffusion during soldering are formed in the edge part of through holes 6a and 6b in power supply layer 9 and ground layer 11.

Further, in this example, a signal wiring of a predetermined width is respectively formed along x-axis or/and y-axis directions in each signal layer 8.

Thermal land 13b formed in ground layer 11 is configured such that non-copper-foil regions 15b, 15b, . . . having a square shape are disposed around through hole 6b that has a circular shape at a predetermined spacing along the x-axis and y-axis directions in a mesh form (a grid form) surrounding through hole 6b as shown in FIG. 4. Further, generally the configuration is such that in thermal land 13b, non-copper-foil regions 16b, 16b, . . . that have a square shape are disposed in a mesh form (a grid form) at a predetermined spacing along the x-axis and y-axis directions to doubly surround non-copper-foil regions 15b, 15b, . . . .

That is, in thermal land 13b, non-copper-foil regions 17b, 18b, and 19b formed by arranging each non-copper-foil region 15b (16b) in a rectangular ring shape are disposed to triply surround through hole 6b.

That is, thermal land 13b includes non-copper-foil regions 17b, 18b and 19b which are formed by arranging each non-copper-foil region 15b (16b) in a rectangular ring shape. Then, these non-copper-foil regions 17b, 18b, and 19b are disposed so as to triply surround through hole 6b.

In this example, four non-copper-foil regions 15b having a relatively large area (for example, the length of a side is about ½ of the diameter of through hole 6b) are disposed in four directions along the x-axis and y-axis directions so as to touch the edge part of through hole 6b. And along the diagonal direction, four non-copper-foil regions 15b are disposed at a predetermined distance away from through hole 6b to form non-copper-foil regions 17b. That is, eight non-copper-foil regions 15b are disposed in a rectangular ring shape around through hole 6b.

Further, around non-copper-foil regions 17b made up of eight non-copper-foil regions 15b disposed in a rectangular ring shape, 16 non-copper-foil regions 16b having a relatively smaller area (for example, the length of a side is about ⅓ of the diameter of through hole 6b) are disposed in a rectangular ring to form non-copper-foil regions 18b. Further, around non-copper-foil regions 18b made up of 16 non-copper-foil regions 16b disposed in a rectangular ring shape, 24 non-copper-foil regions 16b are disposed in a rectangular ring shape to form non-copper-foil regions 19b.

Each non-copper-foil region 15b, 16b is formed through etching of the copper foil to provide a non-conductive region of heat conductivity and electricity. The regions between through hole 6b and diagonally disposed non-copper-foil regions 15b, between non-copper-foil regions 15b and 15b, between non-copper-foil regions 15b and 16b, and between non-copper-foil regions 16b and 16b are made up of copper-foil regions where copper foil for conducting heat and electricity is left.

Herein, the size and shape of each non-copper-foil region 15b, 16b, the disposition pattern of non-copper-foil regions 15b, 16b, the region (range) to form non-copper-foil regions 15b, 16b around through hole 6b, the distances (that is the width of a current flow path) between non-copper-foil regions 15b and 15b, between non-copper-foil regions 16b and 16b, and between non-copper-foil regions 15b and 16b and the like, are set depending on, for example, the tolerance of the heat capacity and current capacity around target through hole 6b.

In this example, signal wirings 8e and 8f and signal wirings 8g and 8h (the paths are shown by a dotted line in FIG. 4) of a predetermined width are formed in a straight line along the x-axis and y-axis directions in signal layers 8 formed immediately above and below ground layer 11 via insulation layer 3.

Herein, signal wirings 8e and 8f are formed in parallel with each other keeping a predetermined spacing on the same plane along the x-axis direction.

Signal wiring 8e is disposed in such a way that its center line overlaps the copper foil region between: non-copper-foil region 15b, inner peripheral side and outer peripheral side non-copper-foil regions 16b disposed along the x-axis direction below through hole 6b in the figure; and inner peripheral side and outer peripheral side non-copper-foil regions 16b arranged below the aforementioned regions (that is, in such a way that signal wiring 8e is covered with the copper foil region). Signal wiring 8f is disposed in such a way that its centerline overlaps the copper-foil region between: inner peripheral side and outer peripheral side non-copper-foil regions 16b disposed along the x-axis direction below through hole 6b in the figure; and outer peripheral side non-copper-foil regions 16b arranged below the aforementioned regions.

Further, signal wirings 8g and 8h are formed in parallel keeping a predetermined distance with each other on the same plane along the y axis.

Signal wiring 8g is disposed in such a way that its centerline overlaps the copper foil region between: non-copper-foil region 15b, inner peripheral side and outer peripheral side non-copper-foil regions 16b disposed along the y-axis direction on the left side of through hole 6b in the figure; and inner peripheral side and outer peripheral side non-copper-foil regions 16b arranged on the left side of the aforementioned regions (that is, in such a way that signal wiring 8g is covered with the copper foil region). Signal wiring 8h is disposed in such a way that its centerline overlaps the copper-foil region between: inner peripheral side and outer peripheral side non-copper-foil regions 16b disposed along the y-axis direction on the left side of through hole 6b in the figure; and outer peripheral side non-copper-foil regions 16b arranged on the left of the aforementioned regions.

Thermal land 13a formed in power supply layer 9 is configured such that non-copper-foil regions 15a, 15a, ... that have a square shape are disposed around through hole 6a that has a circular shape at a predetermined spacing along the x-axis and y-axis directions in a mesh form (a grid form) surrounding through hole 6a as shown in FIG. 5. Further, the general configuration is such that in thermal land 13a, non-copper-foil regions 16a, 16a, ... that have a square shape are disposed in a mesh form (a grid form) at a predetermined spacing along the x-axis and y-axis directions to doubly surround non-copper-foil regions 15a, 15a, ....

That is, in thermal land 13a, non-copper-foil regions 17a, 18a and 19a formed by arranging each non-copper-foil region 15a (16a) in a rectangular ring shape are disposed to triply surround through hole 6a.

In this example, four non-copper-foil regions 15a having a relatively large area area (for example, the length of a side is about ½ of the diameter of through hole 6a) are disposed in four directions along the x-axis and y-axis directions so as to touch the edge part of through hole 6a. And along the diagonal direction, four non-copper-foil regions 15a are disposed at a predetermined distance away from through hole 6a to form non-copper-foil regions 17a. That is, eight non-copper-foil regions 15a are disposed in a rectangular ring shape around through hole 6a.

Further, around non-copper-foil regions 17a made up of eight non-copper-foil regions 15a disposed in a rectangular ring shape, 16 non-copper-foil regions 16a having a relatively smaller area (for example, the length of a side is about ⅓ of the diameter of through hole 6a) are disposed in a rectangular ring to form non-copper-foil regions 18a. Further, around non-copper-foil regions 18a made up of 16 non-copper-foil regions 16a disposed in a rectangular ring shape, 24 non-copper-foil regions 16a are disposed in a rectangular ring shape to form non-copper-foil regions 19a.

Each non-copper-foil region 15a, 16a is formed through etching of the copper foil to provide a non-conductive region of heat and electricity. The regions between through hole 6a and diagonally disposed non-copper-foil regions 15a, between non-copper-foil regions 15a and 15a, between non-copper-foil regions 15a and 16a, and between non-copper-foil regions 16a and 16a are made up of copper-foil regions where copper foil for conducting heat and electricity is left.

Herein, the size and shape of each non-copper-foil region 15a, 16a, the disposition pattern of non-copper-foil regions 15a, 16a, the region (range) to form non-copper-foil regions 15a, 16a around through hole 6a, the distances (that is the width of current flow path) between non-copper-foil regions 15a and 15a, between non-copper-foil regions 16a and 16a, and between non-copper-foil regions 15a and 16a and the like are set depending on, for example, the tolerance of the heat capacity and current capacity around target through hole 6a.

In this example, signal wirings 8a and 8b and signal wirings 8a and 8d (the paths are shown by a dotted line in FIG. 5) of a predetermined width are formed in a straight line along the x-axis and y-axis directions in signal layers 8 formed immediately above and below power supply layer 9 via insulation layer 3.

Herein, a pair of signal wirings 8a and 8b are formed in parallel with each other keeping a predetermined spacing on the same plane along the x-axis direction, and are used as a differential line.

Signal wiring 8a is disposed in such a way that its center line passes the centers of inner peripheral side and outer peripheral side non-copper-foil regions 16a disposed along the x-axis direction below through hole 6a in the figure. Signal wiring 8b is disposed in such a way that its center line passes the centers of non-copper-foil regions 16a disposed along the x-axis direction below through hole 6a in the figure, from among the outer peripheral side non-copper-foil regions 16a disposed in a rectangular ring shape.

Further, a pair of signal wirings 8c and 8d are formed in parallel maintaining a predetermined spacing along the y-axis direction on the same plane, and are used as a differential line.

Signal wiring 8c is disposed in such a way that its center line passes the centers of inner peripheral side and outer peripheral side non-copper-foil regions 16a 16a disposed along the y-axis direction on the left side of through hole 6a in the figure. Signal wiring 8d is disposed in such a way that its center line passes the centers of non-copper-foil regions 16a disposed along the y-axis direction on the left side of through hole 6a in the figure, from among the outer peripheral side non-copper-foil regions 16a disposed in a rectangular ring shape.

Next, the function of the thermal land of the above described configuration will be described with reference to FIGS. 4 to 6.

When performing the soldering to mount through-hole mounted device 4 onto multilayer printed wiring board 1, heat for example supplied from a soldering iron to solder is transferred to each conductive layer 2 via through holes 6a, 6b, . . . as shown in FIG. 6. In power supply layer 9 (ground layer 11), the heat is diffused from each through hole 6a (6b) to the peripheral edge part viewed from through hole 6a (6b).

In thermal land 13a (13b) corresponding to through hole 6a (6b), as shown in FIGS. 4, 5 and 6, heat transferred from through hole 6a (6b), which is filled with solder, is conducted from any point on the inner end edge of the copper foil region between non-copper-foil regions 15a, 15a (15b, 15b) in contact with the edge part of through hole 6a (6b) through the copper foil region between non-copper-foil regions 15a, 15a (15b, 15b) disposed in a rectangular ring shape, the copper foil region between non-copper-foil regions 15a, 16a, (15b, 16b), and the copper foil region between non-copper-foil regions 16a, 16a (16b, 16b), and is caused to bypass through the path of a mesh form and thereby transfer of the heat to solid pattern region surrounding thermal land 13a (13b) is delayed. The present invention enables suppressing heat dissipation in the vicinity of through hole 6a (6b) when soldering is performed, because the copper foil region of the inner peripheral side is narrower than that of the outer peripheral side.

Further, for example, there is formed a copper foil region having a mesh form around through hole 6a (6b). That is, when through-hole mounted device 4 is mounted onto multilayer printed wiring board 1, and thereafter used as electronic equipment installed with multilayer printed wiring board 1, the present invention enables avoiding the local concentration of current in a particular narrow portion since the current path is branched in a complex manner.

Further, signal wirings 8e, 8f and signal wirings 8g, 8h are formed in a straight line respectively maintaining a predetermined spacing along the arrangement direction of non-copper-foil regions 15b, 16b (the x-axis or y-axis direction). Furthermore, signal wirings 8e, 8f and signal wirings 8g, 8h are disposed so as to overlap the copper foil region between non-copper-foil regions 15b and 15b (15b and 16b) (that is, in such a way that signal wirings 8e, 8f and signal wirings 8g, 8h are covered by the copper foil region). As a result of this, a return path of current for signal wirings 8e, 8f and signal wirings 8g, 8h is ensured by opposing ground layer 11.

Further, signal wirings 8a, 8b and signal wirings 8c, 8d, each of which forms a differential signal transmission line, are formed into a straight line maintaining a predetermined spacing along the arrangement direction (the x-axis or y-axis direction) of non-copper-foil region 15a passing through non-copper-foil region 15a. Moreover, since signal wirings 8a, 8b and signal wirings 8c, 8d have the same pattern configuration of the non-copper-foil region/copper foil region as that of opposing power supply layer 9, no difference will arise in the electric properties between a pair of signal wirings.

Thus, according to the configuration of this example, heat transferred from through hole 6a (6b) during the soldering for mounting through-hole mounted device 4 onto multilayer printed wiring board 1 will not be conducted along the radial direction, but be caused to bypass the copper foil region of a mesh form between non-copper-foil regions 15a, 15a (15b, 15b), between non-copper-foil regions 16a, 16a (16b, 16b), and between non-copper-foil regions 15a, 16a (15b, 16b) and thereby transfer of the heat to the solid pattern region around thermal land 13a (13b) is delayed. This will make it possible to decrease the heat capacity of through hole 6a (6b) and to suppress the diffusion of the heat from through hole 6a (6b).

In this way, the heat capacity around trough hole 6a (6b) during soldering is sufficiently decreased by thermal land 13a (13b) formed in the solid pattern of power supply layer 9 (ground layer 11). Therefore, heat is more likely to be conducted to through hole 6a (6b) so that through hole 6a (6b) will be sufficiently heated thereby allowing the temperature inside hole 6a (6b) to rise to a level sufficiently high so as to permit soldering. As a result of this, the molten solder will be satisfactorily drawn up within through hole 6a (6b).

Thus, the present invention enables suppressing heat diffusion to maintain a good finished condition of soldering and to ensure high connection reliability, thereby accommodating trends towards an increase in the number of layers and use of lead-free solder in the printed wiring board.

Further, a copper foil region of a mesh form is formed around through hole 6a (6b). That is, the present invention provides a current path branched in a complex manner thereby ensuring that a current path can avoid the local concentration of current in a particular narrow portion, thus obtaining sufficient current capacity as a whole while providing a relatively low resistance. Therefore, the present invention enables the prevention of malfunctions such as an abnormal temperature rise, voltage drop, and the like.

Further, signal wirings 8e, 8f and signal wirings 8g, 8h are formed in straight lines maintaining a predetermined spacing along the arrangement direction of non-copper-foil regions 15b, 16b (the x-axis or y-axis direction). Furthermore, signal wirings 8e, 8f and signal wirings 8g, 8h are disposed so as to overlap the copper foil region between non-copper-foil regions 15b and 15b (15b and 16b) (that is, in such a way that signal wirings 8e, 8f and signal wirings 8g, 8h are covered by the copper foil region). As a result, the return path of current for signal wirings 8e, 8f and signal wirings 8g, 8h is ensured by opposing ground layer 11 thus maintaining good signal transmission performance. Since the present invention obviates the need to form a bypassing path to avoid non-copper-foil regions, it can ensure sufficient clearance between adjacent signal lines as well as increase signal wiring density.

Further, signal wirings 8*a*, 8*b* and signal wirings 8*c*, 8*d* which respectively form differential signal transmission lines are formed into a straight line so as to pass through non-copper-foil region 15*a* maintaining a predetermined spacing along the arrangement direction (the x-axis or y-axis direction) of non-copper-foil region 15*a*. Moreover, signal wirings 8*a*, 8*b* and signal wirings 8*c*, 8*d* have the same pattern configuration of the non-copper-foil regions/copper foil regions as that of opposing power supply layer 9. Therefore, the present invention enables obtaining good signal transmission performance without producing any difference in electric properties between a pair of signal wirings.

That is, non-copper-foil regions 15*a*, 15*a* through which signal wirings 8*a*, 8*b* pass and non-copper-foil regions 15*a*, 15*a* through which signal wirings 8*c*, 8*d* pass respectively have the same arrangement pattern (the same arrangement direction and the same separation) and the same size and shape. This means that signal wiring 8*a* and signal wiring 8*b* have the same wiring condition, and signal wiring 8*c* and signal wiring 8*d* have the same wiring condition as well.

Further, since the present invention obviates the need to form a bypassing path to avoid non-copper-foil regions, there will be no difference in the wiring length between signal wirings and no noise will be generated as well. This enables forming signal wirings at a high density even in the vicinity of a through hole.

Thus, the present invention has a signal wiring pattern formed in such a way that the signal wirings formed in the vicinity of a through hole adapts the disposition pattern of non-copper-foil regions that have a mesh form, in which the signal wirings are in the signal layers that are opposite to the power supply layer or the ground layer formed with a solid pattern, via an insulation layer. Therefore, the present invention enables maintaining good signal transmission performance of signal wirings and increasing signal wiring density.

Further, the present invention is configured such that non-copper-foil regions 15*a*, 16*a* (15*b*, 16*b*), which have a smaller area relative to related arts, are disposed in a mesh form (a grid form) at a predetermined spacing along the x-axis and y-axis directions. That is, non-copper-foil regions 15*a*, 16*a* (15*b*, 16*b*) are disposed in a regular fashion. This enables preventing deflection (a collapse in a non-copper-foil region) of a signal layer, a power supply layer, and a ground layer as a conductive layer (a metal layer) immediately below or above the portion, in which non-copper-foil regions 15*a*, 16*a* (15*b*, 16*b*) are formed, via an insulation layer, thereby maintaining the evenness of the conductive layers in the vicinity of a through hole. As a result, the present invention enables suppressing variation of electrical properties.

Further, when the disposition pattern of non-copper-foil regions is predefined, the design of the wiring pattern of the opposing signal layer will become easy.

Further, the configuration of the present invention can contribute to the improvement of the reliability of electronic equipment such as computers and communication apparatuses in which multilayer printed wiring board 1 is installed.

Exemplary Embodiment 2

Figure 7:
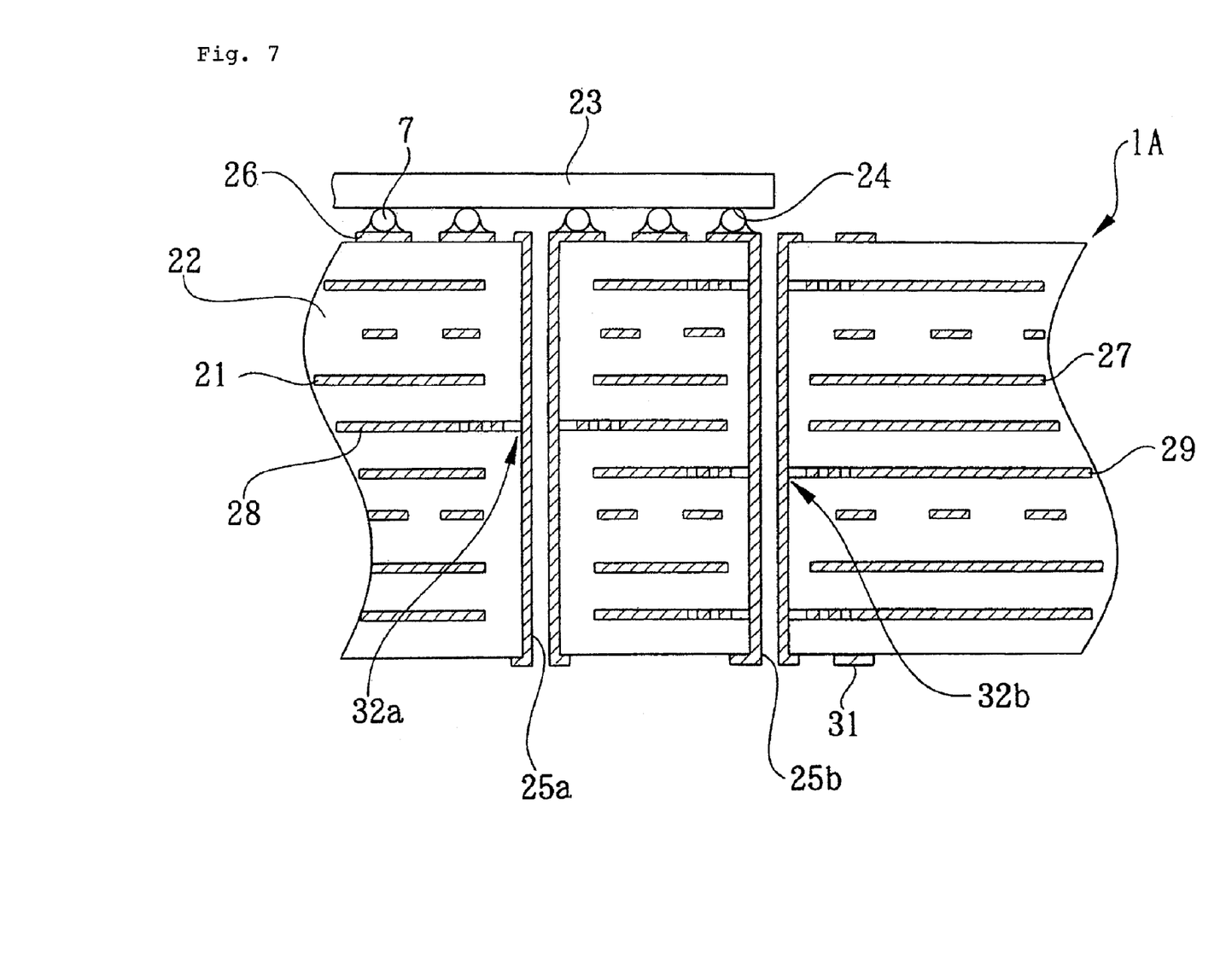
FIG. 7 is a sectional view to show the configuration of the multilayer printed wiring board of a second exemplary embodiment.

FIG. 7 is a sectional view showing the configuration of the multilayer printed wiring board of a second exemplary embodiment.

The feature of the present exemplary embodiment that is different from the above described first exemplary embodiment is that it is applied to the mounting of surface mounted devices (SMD) in place of through-hole mounted devices.

Since the configurations other than the above are roughly the same as those of the above described first exemplary embodiment, in FIG. 7, the same components as those of the first exemplary embodiment are designated by using the same characters as used in FIG. 6, and the description thereof will be shortened.

Multilayer printed wiring board 1A of the present exemplary embodiment is installed in electronic equipment such as computers and communication apparatuses, and has a multilayer structure in which a plurality of conductive layers 21 and insulation layers 22 are alternately laminated as shown in FIG. 7. Further, multilayer printed wiring board 1A includes a plurality of through holes 25*a*, 25*b*, . . . . The plurality of through holes 25*a*, 25*b*, . . . , which penetrate a plurality of conductive layers 21 and insulation layers 22 from the front face to the rear face of multiplayer printed wiring board 1A, are used for connecting connection terminals 24 of surface mounted device 23 as an electronic component or as an electric component to conductive layer 21 which is an inner layer.

Surface mounted device 23 is attached to multilayer printed wiring board 1A with connection terminal 24 being connected to corresponding conductive layer 21 via through holes 25*a*, 25*b*, . . . .

It is noted that the inner walls of through holes 25*a*, 25*b*, . . . are applied with metal plating. Solder pads 26 are formed on the surface of multilayer printed wiring board 1A. Surface mounted device 23 is formed with connection terminals 24 corresponding to solder pads 26. As the result of connection terminal 24 of surface mounted device 23 being physically and electrically connected to solder pad 26 via solder 7, surface mounted device 23 is attached to multilayer printed wiring board 1A.

For example, through hole 25*a* is connected to power supply layer 28 as well as to corresponding solder pad 26. Moreover, through hole 25*b* is connected to ground layer 29 as well as to corresponding solder pad 26.

Each conductive layer 21 is made up of signal layer 27, power supply layer 28, ground layer 29 or surface layer 31 including solder pad 26. In the present exemplary embodiment, there is shown an example of a multilayer printed wiring board that has a 10-layer structure made up of four signal layers 27, one power supply layer 28, three ground layers 29, and two surface layers 31.

In particular, power supply layer 28 and ground layer 29 are each configured to have a solid pattern in which a conductive region is formed over the entire surface except through holes 25*a*, 25*b*, . . . and except non-copper-foil regions of a mesh form around through holes 25*a*, 25*b*, . . . . Further, thermal lands 32*a*, 32*b*, . . . for suppressing heat diffusion during soldering are formed in the edge part of through holes 25*a*, 25*b*, . . . in power supply layer 28 and ground layer 29.

Thermal lands 32*a*, 32*b*, . . . of the present exemplary embodiment have substantially the same configuration as that of thermal lands 13*a*, 13*b*, . . . of the above described first exemplary embodiment.

Thermal lands 32*a*, 32*b*, . . . for suppressing heat diffusion are formed around through holes 25*a*, 25*b*, . . . of power supply layer 28 and ground layer 29. As the result, when performing soldering to mount surface mounted device 23 onto multilayer printed wiring board 1A, heat conduction through solder pad 26, through hole 25*a* (25*b*), and through power supply layer 28 (ground layer 29) is suppressed so that the heat capacity around solder pad 26 that behaves as surface layer 31 is controlled to be sufficiently small. Consequently, solder 7 is sufficiently heated to be melted so that satisfactory soldering can be performed.

Further, a copper foil region of a mesh form is formed around through hole 32a (32b). That is, when electronic equipment installed with multilayer printed wiring board 1A is used after surface mounted device 23 is mounted onto multilayer printed wiring board 1A, the present invention enables avoiding local concentration of current in a particular narrow portion since the current path is branched in a complex manner. Thus, since enough current capacity as a whole can be obtained while resistance is relatively low, the present invention enables prevention of malfunctions such as an abnormal temperature rise, voltage drop, and the like.

According to the configuration of the present exemplary embodiment, it is possible to achieve substantially the same effects as those of the above described first exemplary embodiment.

Exemplary Embodiment 3

Figure 8:
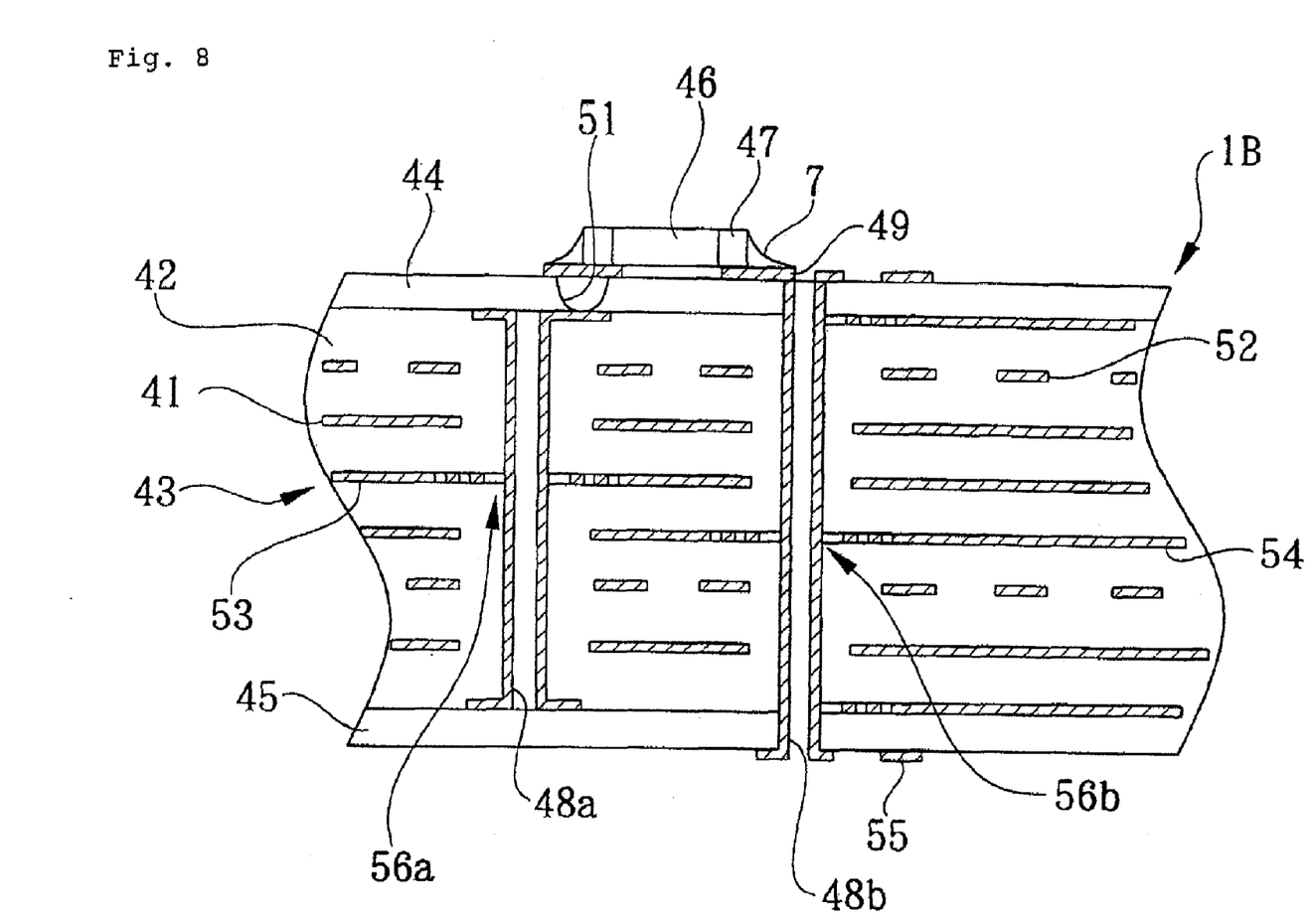
FIG. 8 is a sectional view to show the configuration of the multilayer printed wiring board of a third exemplary embodiment.

FIG. 8 is a sectional view showing the configuration of the multilayer printed wiring board of a third exemplary embodiment.

The feature of the present exemplary embodiment is that significantly different from the second exemplary embodiment is that multilayer printed wiring board 1A is configured to be a built-up substrate.

Since the configurations other than the above are roughly the same as those of the above described second exemplary embodiment, in FIG. 8, the same components as those of the second exemplary embodiment are designated by using the same characters as used in FIG. 7, and the description thereof will be shortened.

Multilayer printed wiring board 1B of the present exemplary embodiment is installed in electronic equipment such as computers and communication apparatuses. Multilayer printed wiring board 1B is made up of core layer 43 and a built-up substrate as shown in FIG. 8. Core layer 43 is a multilayer structure in which a plurality of conductive layers 41 and insulation layers 42 are alternately laminated. The built-up substrate includes built-up layers 44 and 45. Further, multilayer printed wiring board 1B includes through hole 48a and through hole 48b. Through hole 48a penetrates a plurality of conductive layers 41 and insulation layers 42 from the front face to the rear face of core layer 43. Through hole 48b penetrates core layer 43 and built-up layers 44 and 45 from the front face of built-up layer 44 to the rear face of built-up layer 45. Through hole 48a and through hole 48b both cause connection terminal 47 of surface mounted device 46 to be connected with conductive layer 41 which is an inner layer.

It is noted that the inner walls of through holes 48a and 48b, . . . are applied with metal plating. Solder pads 49 are formed on the surface of multilayer printed wiring board 1B. Surface mounted device 46 is formed with connection terminals 47 corresponding to solder pads 49. As the result of connection terminal 47 of surface mounted device 46 being connected to solder pad 49 via solder 7, surface mounted device 46 is attached to multilayer printed wiring board 1B. Moreover, predetermined connection terminal 47 is connected to predetermined conductive layer 41 through via hole 51 and through hole 48a formed in built-up layer 44.

For example, through hole 48a is connected to power supply layer 53 as well as to corresponding solder pad 49 through via hole 51. Moreover, through hole 48b is connected to ground layer 54 as well as to corresponding solder pad 49.

Each conductive layer 41 is made up of signal layer 52, power supply layer 53, ground layer 54 or surface layer 55 including solder pad 49. In particular, power supply layer 53 and ground layer 54 are each configured to have a solid pattern in which a conductive region is formed over the entire surface except through holes 48a and 48b, and the except non-copper-foil regions of a mesh form around through holes 48a and 48b. Further, thermal lands 56a and 56b for suppressing heat diffusion during soldering are formed at the edge part of through holes 48a and 48b in power supply layer 53 and ground layer 54.

Thermal lands 56a and 56b of the present exemplary embodiment have substantially the same configuration as that of thermal lands 32a, 32b, . . . of the above described second exemplary embodiment.

Thermal land 56a (56b) for suppressing heat diffusion is formed around through hole 48a (48b) of power supply layer 53 (ground layer 54). As the result, when performing soldering to mount surface mounted device 46 onto multilayer printed wiring board 1B, heat conduction through solder pad 49, via hole 51, through hole 48a, and power supply layer 53 (solder pad 49, through hole 48b, and ground layer 54) is suppressed so that the heat capacity around solder pad 49 as surface layer 55 is controlled to be sufficiently small. Consequently, solder 7 is sufficiently heated to be melted so that satisfactory soldering can be performed.

Further, a copper foil region of a mesh form is formed around through hole 48a (48b). That is, when electronic equipment installed with multilayer printed wiring board 1B is used after surface mounted device 46 is mounted onto multilayer printed wiring board 1B, the present invention enables avoiding local concentration of current in a particular narrow portion since the current path is branched in a complex manner. Thus, since enough current capacity as a whole can be obtained while resistance is relatively low, the present invention enables the prevention of malfunctions such as an abnormal temperature rise, voltage drop, and the like.

According to the configuration of the present exemplary embodiment, it is possible to achieve substantially the same effects as those of the above described second exemplary embodiment.

So far the exemplary embodiments have been described in detail with reference to the drawings, specific configurations are not limited to the exemplary embodiments, and alterations of design etc., which do not depart from the spirit of the present invention, will be included in the present invention.

For example, although in the above described exemplary embodiments, description has been made of the case in which the shape of a non-copper-foil region is a square, the shape is not limited to a square, but may be a circle, an eclipse, a polygon, or an undefined shape. Further, an asymmetric shape may also be used depending on the wiring pattern of the formed layer and the arrangement pattern of other through holes.

Further, although in the above described exemplary embodiment, description has been made of the case in which ring-shape non-copper-foil regions are triply disposed, such regions may be quadruply disposed, or singly or doubly disposed. Moreover, although in the above described exemplary embodiments, description has been made of the case in which the size of a non-copper-foil region which makes up non-copper-foil regions is changed in two steps, the change may be in three or more steps, or the size may be uniform.

Further, the arrangement direction of non-copper-foil regions may not be orthogonal, but may be oblique. Moreover, the mesh structure is not limited to a grid form, but may be a triangular mesh.

Furthermore, the thermal land in which the non-copper-foil region of the present invention is disposed in a mesh form may not be formed around all through holes in the power supply layer and the ground layer, and for example, thermal lands of related configuration may be formed in the portion where signal wirings that are to be protected are not formed in the vicinity thereof.

Moreover, the invention may be applied to the case in which besides copper foil, for example, silver foil and aluminum foil are used as the metal foil.

Further, the present invention may be applied to the case in which the conductive layer is formed by a method of etching the metal foil that is adhered to an insulation layer, as well as by a method of plating.

Furthermore, the present invention may be applied to the case in which a method of forming an insulation layer having a plate shape, film shape, or membrane shape made of, for example, epoxy resin, polyimide resin, and the like as the insulation layer between layers (between conductive layers) is used.

The present invention can also be applied to the case in which a conductive layer, in which power supply wiring, ground wiring, and signal wiring are mixed, is formed in the same plane as the conductive layer in a printed wiring board.

The invention claimed is:

1. A printed wiring board, comprising:
   an electric component mounted on a front surface of said printed wiring board;
   an insulation layer and a conductive layer which are alternately laminated between said front surface and a rear face of said printed wiring board;
   a solid region having a high heat capacity, said solid region being formed in a predetermined portion of the conductive layer, and being electrically connected to said electric component via a through hole, said through hole penetrating from said front surface to said rear face via said conductive layer and said insulation layer; and
   a thermal land formed in said solid region penetrated by said through hole such that a nonconductor portion is disposed in a distributed pattern of a mesh form or a matrix form adjacent to said through hole.

2. The printed wiring board according to claim 1, wherein signal wirings are formed so as not to overlap said nonconductor portion, said signal wirings being adjacent to said nonconductor portion via said insulation layer, along an arrangement direction of said nonconductor portion.

3. The printed wiring board according to claim 1, wherein said solid region is a power supply line or a ground line.

4. The printed wiring board according to claim 2, wherein said thermal land is provided around said through hole of said solid region, said signal wiring being formed on at least one side of said solid region via said insulation layer; said signal wiring is formed along first or/and second directions which intersect each other on the same plane; and at least part of said nonconductor portion is arranged along said first or/and second directions.

5. The printed wiring board according to claim 1, wherein nonconductor regions in which said nonconductor portions of a predetermined size are disposed in a substantially rectangular ring shape are provided around said through hole in multiple folds, and wherein the sizes of said nonconductor portions making up said nonconductor regions are configured to be different from each other along the direction that proceeds away from the center of said through hole.

6. The printed wiring board according to claim 5, wherein the size of said nonconductor portion making up said nonconductor regions is configured to become smaller along said direction.

7. The printed wiring board according to claim 1, wherein a pair of signal wirings which are adjacent to said nonconductor portions via said insulation layer, along the arrangement direction of said nonconductor portions and which make up a differential signal transmission line are both formed so as to overlap said nonconductor portions or so as to overlap the conductor portion in the vicinity of the nonconductor portions, and so as to pass through said nonconductor portions or said conductor portion in a substantially same section along the wiring path.

8. The printed wiring board according to claim 1, wherein said thermal land is formed to suppress heat dissipation when performing soldering of a lead terminal provided in said electric component with said conductive layer at a portion of said through hole being in a condition in which said lead terminal is inserted into said through hole.

9. The printed wiring board according to claim 1, wherein a connection terminal provided in said electric component as a surface-mounted device and said conductive layer are connected via said through hole.

10. Electronic equipment comprising The printed wiring board according to claim 1.

11. The printed wiring board according to claim 1, wherein said nonconductor portion is disposed in multiple folds.

* * * * *